United States Patent
Kitano et al.

(10) Patent No.: US 7,382,007 B2
(45) Date of Patent: Jun. 3, 2008

(54) SOLID-STATE IMAGE PICKUP DEVICE AND MANUFACTURING METHOD FOR THE SAME

(75) Inventors: Yoshiaki Kitano, Kanagawa (JP); Nobuhiro Karasawa, Kanagawa (JP); Jun Kuroiwa, Kanagawa (JP); Hideshi Abe, Kanagawa (JP); Mitsuru Sato, Kanagawa (JP); Hiroaki Ohki, Kanagawa (JP)

(73) Assignee: Sony Corporation, Tokyo (JP)

( * ) Notice: Subject to any disclaimer, the term of this patent is extended or adjusted under 35 U.S.C. 154(b) by 132 days.

(21) Appl. No.: 11/324,657

(22) Filed: Jan. 3, 2006

(65) Prior Publication Data

US 2006/0108617 A1 May 25, 2006

Related U.S. Application Data

(63) Continuation of application No. 10/815,875, filed on Apr. 1, 2004, now Pat. No. 7,084,443.

(30) Foreign Application Priority Data

Apr. 2, 2003 (JP) .............................. 2003-098783
Nov. 20, 2003 (JP) .............................. 2003-390305

(51) Int. Cl.
H01L 31/062 (2006.01)
H01L 31/113 (2006.01)
H01L 31/06 (2006.01)
H01L 29/04 (2006.01)
H01L 29/15 (2006.01)

(52) U.S. Cl. .................. 257/291; 257/59; 257/72; 257/292; 257/293; 257/294; 257/461; 257/462; 257/463; 257/464; 257/465

(58) Field of Classification Search ............ 257/59, 257/72, 291–294, 461–465
See application file for complete search history.

(56) References Cited

U.S. PATENT DOCUMENTS

| 5,466,612 A | * | 11/1995 | Fuse et al. | 438/60 |
| 5,744,831 A | * | 4/1998 | Tanaka | 257/225 |
| 5,844,290 A | * | 12/1998 | Furumiya | 257/432 |
| 5,959,318 A | * | 9/1999 | Shim et al. | 257/231 |
| 6,614,479 B1 | * | 9/2003 | Fukusho et al. | 348/340 |
| 6,891,243 B2 | | 5/2005 | Adachi et al. | |

* cited by examiner

*Primary Examiner*—Ida M. Soward
(74) *Attorney, Agent, or Firm*—Robert J. Depke; Rockey, Depke & Lyons LLC.

(57) ABSTRACT

A solid-state image pickup device includes, in a substrate, a plurality of photoelectric conversion regions for subjecting incoming light to photoelectric conversion, a reading gate for reading a signal charge from the photoelectric conversion regions, and a transfer register (vertical register) for transferring the signal charge read by the reading gate. Therein, a groove is formed on the surface side of the substrate, and the transfer register and the reading gate are formed at the bottom part of the groove. With such a structure, in the solid-state image pickup device, reduction can be achieved for the smear characteristics, a reading voltage, noise, and others.

15 Claims, 14 Drawing Sheets

FIG. A
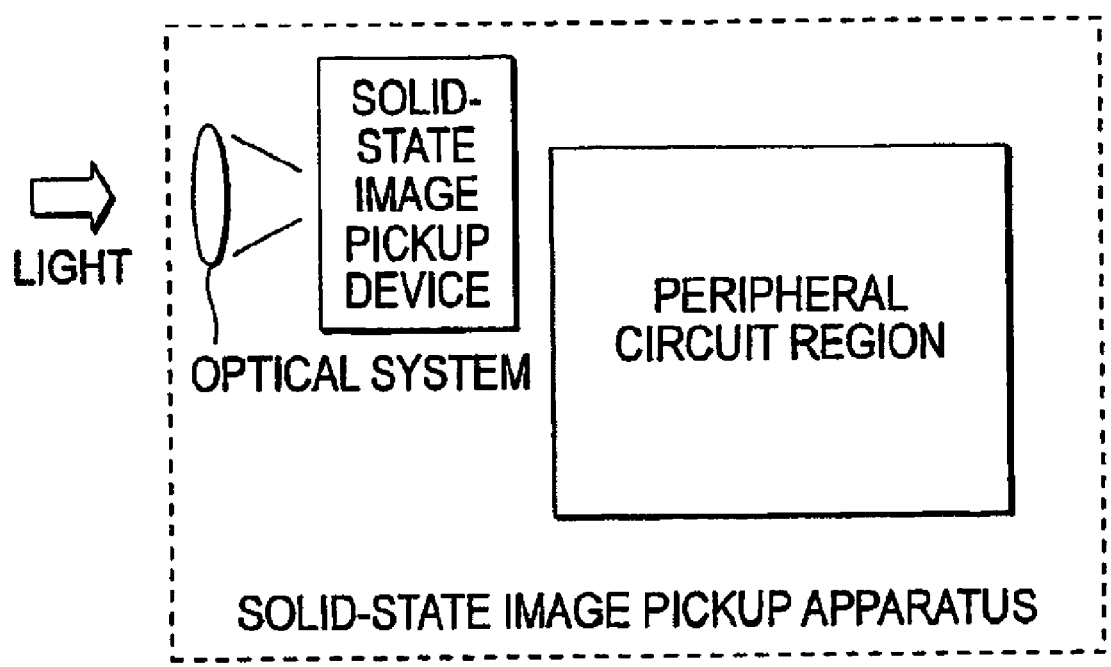

SOLID-STATE IMAGE PICKUP DEVICE AND MANUFACTURING METHOD FOR THE SAME

The subject matter of application Ser. No. 10/815,875, is incorporated herein by reference. The present application is a continuation of U.S. Ser. No. 10/815,875, filed Apr. 1, 2004 now U.S. Pat. No. 7,084,443 which claims priority to Japanese Patent Application Nos. JP2003-098783 filed Apr. 2, 2003 and JP2003-390305 filed Nov. 20, 2003 which are incorporated herein by reference.

BACKGROUND OF THE INVENTION

1. Field of the Invention

The present invention relates to a solid-state image pickup device and a manufacturing method therefor and, more specifically, to a solid-state image pickup device operating in an interlace mode with a light shielding film provided, and a manufacturing method therefor.

2. Description of the Related Art

A solid-state image pickup device of a conventional type operating in an interlace mode is structured by a flat N-type silicon substrate 111 formed thereon with a photoelectric conversion region 112 as shown in FIGS. 16A and 16B. Specifically, FIG. 16A is the layout view, and FIG. 16B shows the schematic cross-sectional view. The photoelectric conversion region 112 has the upper layer of a hole accumulation layer 113 that is a $P^+$-type layer, and the lower layer of an N-type layer 114. The N-type layer 114 of the photoelectric conversion region 112 is formed deep into the silicon substrate 111. This is because the hole accumulation layer 113 is so formed as to appear on the surface of the silicon substrate 111. One side of the photoelectric conversion region 112 is formed with a vertical register 116 via a reading gate 115. This vertical register 116 has the upper layer of an N-type layer 117, and beyond thereto, a $P^+$-type layer 118 is located. For partitioning a pixel region, a pixel separation region 119 is formed. Via this pixel separation region 119, the other side of the photoelectric conversion region 112 is formed with another vertical register 116 for partitioning from the pixel locating adjacent thereto. This vertical register 116 has the upper layer of an N-type layer, which is formed as closer as possible to the surface of the silicon substrate 111 to carry the charge as much as possible. On the vertical register 116 and the reading gate 115, an electrode 122 is formed with an insulation film 121 locating therebetween. This electrode 122 serves as an electrode for charge reading and transferring. In this example, shown is an electrode in a two-layer structure. A light shielding film 133 is formed with an opening 132 locating on the photoelectric conversion region 112, via an inter-layer insulation film 131.

In a general manner for charge reading from the photoelectric conversion region 112 to the vertical register 116, voltage is applied to the electrode 122 serving as an electrode for charge reading and transferring so that the vertical register 116 and the reading gate 115 are both changed in potential. The voltage is continuously applied to the electrode 122 until the reading gate 115 becomes lower in potential than the N-type layer 114 of the photoelectrical conversion region 112.

The issue here is that changing the potential of the reading gate 115 to be lower than that of the N-type layer 114 of the photoelectrical conversion region 112 requires considerably high voltage. This is because, in the conventional structure, the N-type layer 114 of the photoelectrical conversion region 112 is formed deeper in the silicon substrate 111 compared with the N-type layer 117 of the vertical register 116. The potential of the reading gate 115 is modulated by lateral diffusion due to the heat of the hole accumulation layer 113. This moves the maximum potential of the reading gate 115 serving as a charge reading path deep down into the silicon substrate 111. As a result, the potential at the position shows less change with respect to the reading voltage, problematically increasing the reading voltage to a greater degree.

Furthermore, there has been a demand for pixels smaller in size in consideration of the expected trend of higher resolution. With the concern for maintaining the pixel properties, however, it has been difficult to reduce the height difference of electrodes and others to a greater degree than currently achieved. Thus, reducing the pixels in size may reduce the light-gathering capability.

A solid-state image pickup device with a groove is found in Patent Document 1. Therein, for the purpose of reducing the reading voltage and expanding the control margin of the reading voltage, a photodiode and a vertical transfer section are both arranged in an array. The surface of a substrate has a groove for use as a channel opposing to a reading electrode and a transfer electrode. These electrodes are those provided for charge reading and transferring from the photodiodes to the vertical transfer sections.

As such, to meet the demand of smaller-sized solid-state image pickup devices and higher resolution, the vertical transfer section is required to handle the more amount of charge. This is the reason why, in Patent Document 1, the substrate is formed with the groove as the expected solution. In detail, to increase the amount of charge for the vertical transfer section to handle, the side parts of the groove are used also as the vertical transfer section so that the effective area for charge transfer is increased. Furthermore, in consideration of another demand for lower power consumption, there needs to reduce the reading voltage from the photo diode section to the vertical transfer section.

[Patent Document 1] JP-A-11-97666 (pages 3 to 4, and FIG. 1)

The issue here is that such a structure has the following problems as forming a groove on the surface of a substrate for use as a channel opposing to a charge reading electrode and a charge transfer electrode. That is, end parts of a polysilicon electrode operating for charge reading and transferring are not located in the groove but merely on the substrate. Thus, reducing the height difference of the polysilicon electrode is difficult. The polysilicon electrode is not placed directly above the reading gate. The potential of the reading gate is thus modulated by lateral diffusion due to the heat of a hole accumulation layer. This accordingly moves the maximum potential of the reading gate serving as a charge reading path deep down into the silicon substrate. As a result, the potential at the position shows less change with respect to the reading voltage, failing to solve the problem of increasing reading voltage. Here, even when a light-shielding film is formed to cover the polysilicon electrode may be a possibility, the resulting film simply covers the polysilicon electrode on the surface of the substrate, failing to fully achieve the expected light-shielding effect, and reducing the smear characteristics. Moreover, although reducing the reading section in width may be an effective option for voltage reduction, this easily causes blooming. In consideration as such, it has been expected to increase the amount of charge to be handled by the vertical transfer section simultaneously with reducing the reading voltage.

SUMMARY OF THE INVENTION

Therefore, an object of the present invention is to reduce the reading voltage through prevention of the smear characteristics from being reduced in association with size reduction of the unit pixel, through reduction of height difference of the substrate surface, and through influence suppression of the accumulation layer over the photoelectric conversion regions.

To achieve the above object, a first aspect of the present invention is directed to a solid-state image pickup device provided with, in a substrate: a plurality of photoelectric conversion regions for subjecting incoming light to photoelectric conversion; a reading gate for reading a signal charge from the photoelectric conversion regions; and a transfer register for transferring the signal charge read by the reading gate. The solid-state image pickup device is mostly characterized in that a groove is formed on the surface of the substrate, and at the bottom of the groove, the transfer register and the reading gate are formed.

According to a second aspect, in the present invention, the groove formed on the substrate has a lattice structure. According to a third aspect, the groove is plurally segmented in height.

A solid-state image pickup device manufactured by a method of the present invention is mostly characterized in including, in a substrate, all of the following constituents, i.e., a pixel separation region for partitioning pixel regions into several region, a plurality of photoelectric conversion regions for subjecting incoming light to photoelectric conversion, a reading gate for reading a signal charge from the photoelectric conversion regions, and a transfer register for transferring the signal charge read by the reading gate.

With the above structures, the object of the present invention can be realized. That is, a substrate is formed with a groove, and at the substrate bottom of the groove, a pixel separation region, a transfer register, and a reading gate are formed. As to electrodes of the transfer register and the reading gate, their parts directed in the vertical transfer direction are located in the groove.

BRIEF DESCRIPTION OF THE DRAWINGS

FIG. 1A is a plan view of layout, and FIG. 1B is a schematic cross-sectional view cut along a line 1B-1B of FIG. 1A;

FIG. 16A is a layout plan, and FIG. 16B is a schematic cross-sectional view cut along a line 16B-16B of FIG. 16A; and FIG. A is a layout plan showing an exemplary result derived by applying the present invention to a solid-state image pickup device.

DETAILED DESCRIPTION OF THE INVENTION

First Embodiment

Figure 1A:
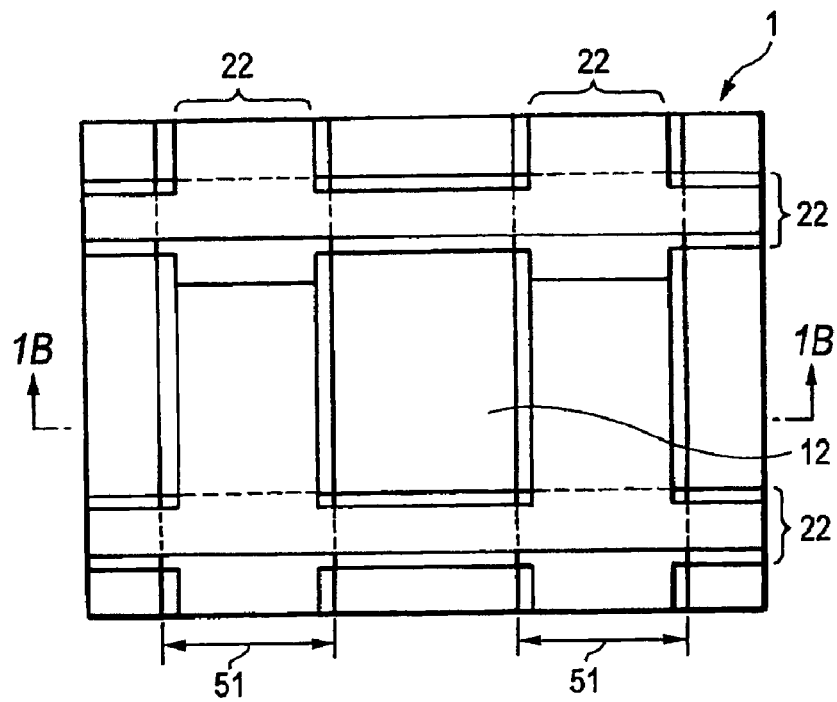
FIGS. 1A and 1B are both a diagram showing a solid-state image pickup device of a first embodiment of the present invention, and specifically.
Figure 1B:
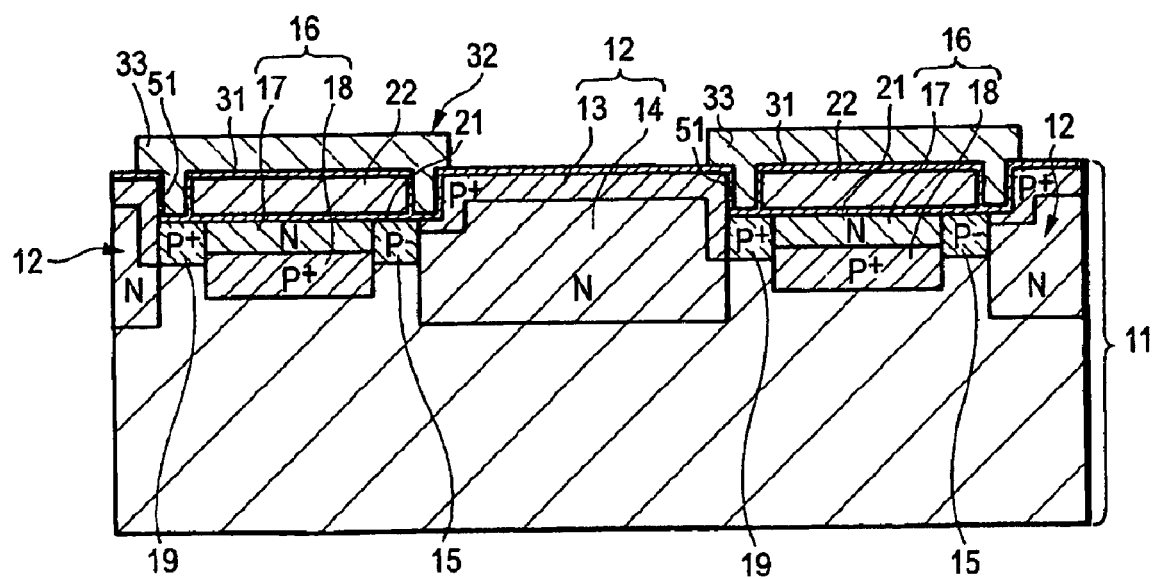

By referring to FIGS. 1A and 1B, a solid-state image pickup device of a first embodiment is described. Specifically, FIG. 1A is a plan view of layout, and FIG. 1B is the schematic cross-sectional view cut along a line 1B-1B of FIG. 1A.

As shown in FIGS. 1A and 1B, in a solid-state image pickup device 1, a substrate 11 is formed with a groove 51. The groove 51 is formed in a region to which an electrode is formed in a transfer register direction (vertical transfer direction), for example. The groove 51 has the depth of 0.01 µm to 5 µm from the surface of the substrate 11, for example. This depth is about the same or less as that of a bonding section between a hole accumulation layer 13 and an N-type layer 14, both of which are formed on a photoelectric conversion region 12. The substrate 11 is a semiconductor substrate, e.g., silicon substrate. The groove 51 and the photoelectric conversion region 12 are formed adjacent to each other. The photoelectric conversion region 12 has the upper layer of the hole accumulation layer 13, and beyond thereto, the N-type layer 14 is located. From the side of the photoelectric conversion region 12, at the substrate bottom of the groove 51, a reading gate 15, a vertical register 16, and a pixel separation region 19 are formed. The reading gate 15 is a $P^-$-type layer. The transfer register (vertical register) 16 has the upper layer of an N-type layer 17, and the lower layer of a $P^+$-type layer 18.

A gate insulation film 21 is so formed as to cover the surface of the substrate 11 and the inner plane of the groove 51. In the groove 51 that is covered by the gate insulation film 21, an electrode 22 is formed for charge reading and transferring. In this example, the electrode 22 is formed in a two-layer structure. This is not restrictive, and the electrode 22 may be in a one-, three-, or four-layer structure. As shown in the drawing, this electrode 22 is preferably formed directly above the reading gate 15 and the vertical register 16.

On the surface of the substrate 11, an inter-layer insulation film 31 is so formed as to cover the electrode 22. Thereover, a light-shielding film 33 is formed in such a manner as to fill the gap between the sidewall of the groove 51 and the electrode 22 via the inter-layer insulation film 21. The light-shielding film 33 has an opening 32 locating on the photoelectric conversion region 12.

In such a solid-state image pickup device 1 as having the electrode 22 formed in the groove 51, the reading voltage is successfully reduced, and the light-gathering capability can be improved thanks to the structure reduced in height difference. To be more specific, the substrate 11 is formed with the groove 51, and at the substrate bottom of the groove 51, the reading gate 15, the vertical register 16, and the pixel separation region 19 are formed. Directly above those constituents via the gate insulation film 21, the electrode 22 is formed for charge reading and transferring. Such a structure shortens the distance, in the substrate depth direction, among the N-type layer 14 of the photoelectrical conversion region 12, the N-type layer 18 of the vertical register 16, and the electrode 22. This leads greater fluctuations in voltage to be applied to the electrode 22 showing the maximum potential in a charge reading path, i.e., the reading gate 15. Accordingly, the reading voltage can be favorably reduced. Further, diffusion caused due to the heat of the hole accumulation layer 13 can be shielded by the height difference made by the groove 51, leading to little influence on the potential of the reading gate 15. This also can reduce the reading voltage. Moreover, with the structure of embedding the electrode 22 in the groove 51, the height difference is reduced in the horizontal direction. Accordingly, the light-gathering capability is improved, consequently leading to the better pixel properties, e.g., sensitivity, and shading. Details thereof are left for later description. Also with the structure of filling the gap between the groove 51 and the electrode 22 with the light-shielding film 33 via the inter-layer insulation film 31, the smear components often generated by direct light jumping into the vertical register 16 can be reduced. Details thereof are also left for later description.

Second Embodiment

Described next is a solid-state image pickup device of a second embodiment of the present invention by referring to the schematic cross-sectional view of FIG. 2.

Figure 2:
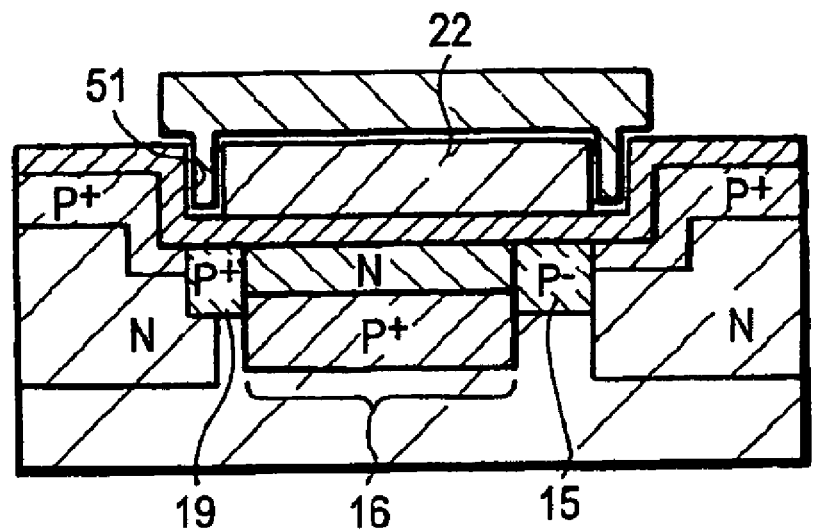
FIG. 2 is a schematic cross-sectional view of a solid-state image pickup device of a second embodiment of the present invention.

As shown in FIG. 2, the structure of the second embodiment is the same as that of the first embodiment except the following. That is, as to the electrode 22, its parts in the transfer register direction (vertical transfer direction) are formed, in the groove 51, at least partially on the pixel separation region 19, and on the vertical register 16 and the reading gate 15.

Third Embodiment

Described next is a solid-state image pickup device of a third embodiment of the present invention by referring to the schematic cross-sectional view of FIG. 3.

Figure 3:
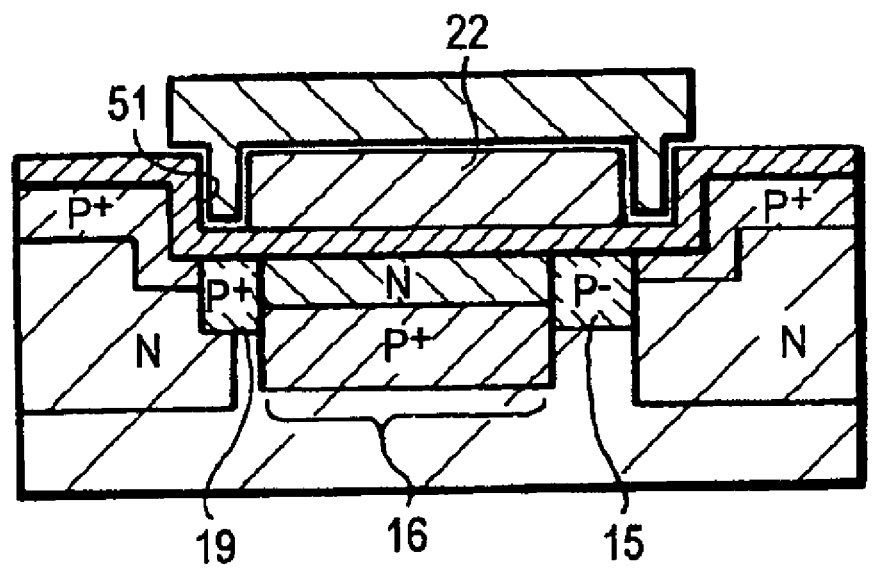
FIG. 3 is a schematic cross-sectional view of a solid-state image pickup device of a third embodiment of the present invention.

As shown in FIG. 3, the structure of the third embodiment is the same as that of the first embodiment except the following. That is, as to the electrode 22, parts in the transfer register direction (vertical transfer direction) are formed, in the groove 51, at least partially on the pixel separation region 19, and partially on the vertical register 16, and the reading gate 15.

With the electrode 22 formed as such in the second and third embodiments, the same effects as described in the first embodiment can be achieved, e.g., reduction of the smear characteristics, and reduction of the reading voltage. At the time of manufacturing the electrode 22 and others, any displacement caused by mask alignment in a lithography process becomes favorably allowable. As such, from a manufacturing viewpoint, yields can be effectively increased.

Figure 4:
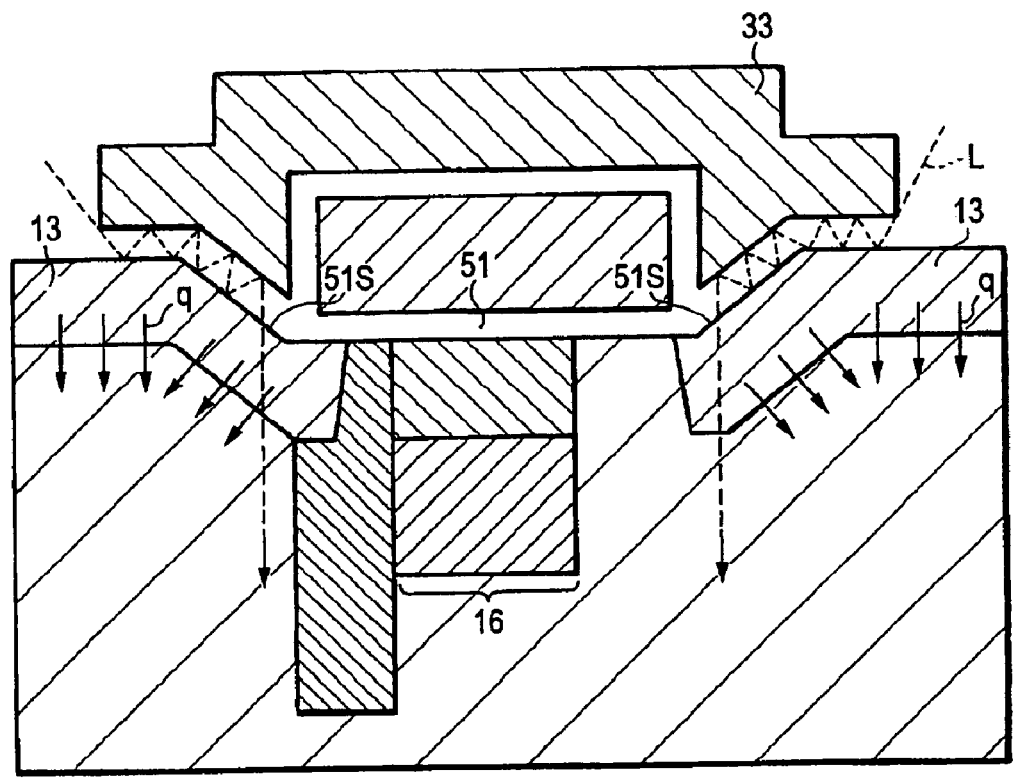
FIG. 4 is a schematic cross-sectional view for illustrating the effects achieved by side planes (slope planes) of a groove.

In the above first to third embodiments, as shown in the schematic cross-sectional view of FIG. 4, the sidewalls of the groove 51 may be formed by slope planes 51S. The slope plane 51S is sloped with respect to the surface of the substrate 11 at an angle of 90 degrees or smaller. By sloping the sidewalls of the groove 51 as such, light L and a charge q are both directed not toward the vertical register 16 but directly downward or toward the photoelectric conversion region. Accordingly, the smear characteristics can be reduced with noise reduction. Herein, the light L is the one reflected below the light-shielding film 33, and the charge q is a result of photoelectric conversion on the very surface of the photoelectric conversion region (sensor).

The substrate 11 of the slope planes 51S is a $P^+$-type layer, e.g., the hole accumulation layer 13. Such a structure prevents noise occurrence.

In the above first to third embodiments, the light-shielding film 33 is preferably applied with a pulse voltage, or a direct voltage. Through voltage application as such to the light-shielding film 33, noise occurrence is successfully prevented. In the case of applying the pulse voltage to the light-shielding film 33, the light-shielding film 33 can be applied with pulses synchronized to reading pulses. This accordingly assists reading so that the reading voltage can be reduced. In the case of applying the direct voltage to the light-shielding film 33, the surface of the sensor can be provided with pinning enhancement. Similarly, through application of a negative voltage at the time of charge transferring, the reading gate 15 can be increased in height to block the potential. As a result, the blooming characteristics can be improved.

In the above first to third embodiments, including the substrate 11 from the bottom part of the groove 51 to one sidewall section of the groove 51, the reading gate 15 may be formed to be placed across the substrate 11 locating upper to the sidewall. Such a structure favorably prevents noise.

Fourth Embodiment

Described next is a solid-state image pickup device of a fourth embodiment by referring to FIG. 5 to FIG. 6C, i.e., a plan layout view, and schematic cross-sectional views all cut along a line 6A-6A of FIG. 5.

Figure 5:
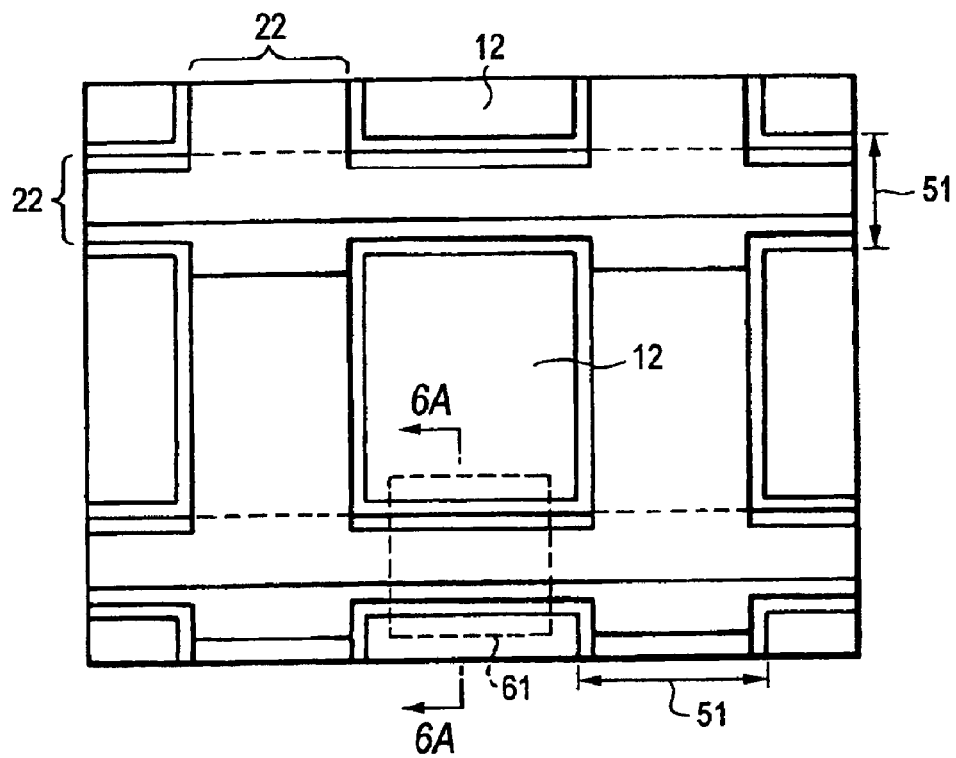
FIG. 5 is a plan view of a layout of a solid-state image pickup device of a fourth embodiment of the present invention.

As shown in FIG. 5, the structure of the fourth embodiment is the same as that of the first to third embodiments except the following. That is, a solid-state image pickup device 2 has the lattice-shaped groove 51 formed on the substrate 11 in the horizontal transfer direction. Also in this groove 51, the electrode 22 is embedded. In this example, the electrode 22 is formed in a two-layer structure. This is not restrictive, and the electrode 22 may be in a one-, three-, or four-layer structure. At the substrate 11 bottom of the groove 51 between the photoelectric conversion regions 12 in the vertical transfer direction, a pixel separation region 61 is provided. In the drawing, although only a piece of the pixel separation region 61 is shown, another is also formed between the photoelectric conversion regions 12 in the transfer register direction (vertical transfer direction). Such a pixel separation region 61 may be so formed as to locate partially beneath the photoelectric conversion region 12. The groove 51 has the same depth as the one in the first to the third embodiments.

Figure 6A:
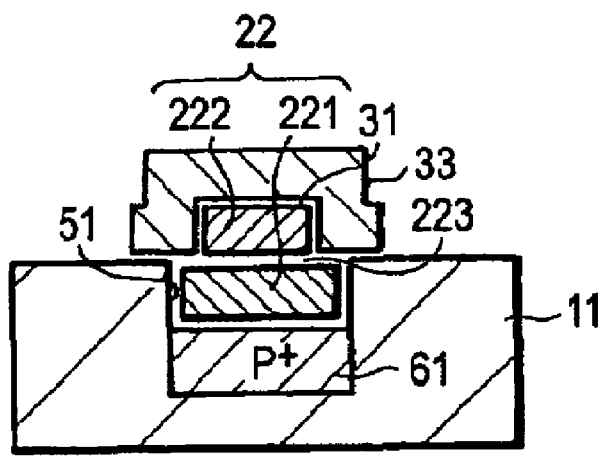
FIGS. 6A to 6C are all a schematic cross-sectional view of a solid-state image pickup device of a fourth embodiment, cut along a line 6A-6A of FIG. 5.

By referring to FIG. 6A, between the photoelectric conversion regions 12 in the vertical transfer direction (refer to FIG. 5), formed in the groove 51 is a first-layer electrode 221 of the electrode 22. On the first-layer electrode 221, a second-layer electrode 222 is formed via an insulation film 223. In this example, the first-layer electrode 221 is fitting within the groove 51 but the second-layer electrode 222 is not. Over the electrode 22 (second-layer electrode 222) and the groove 51, the light-shielding film 33 is formed to cover those via the inter-layer insulation film 31. At the bottom substrate 11 of the groove 51, the pixel separation region 61 is formed.

Figure 6B:
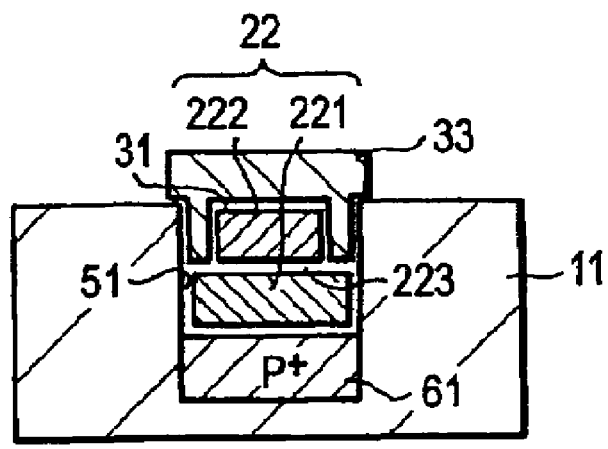

In an alternative structure, referring to FIG. 6B, between the photoelectric conversion regions 12 in the vertical transfer direction, the first-layer electrode 221 of the electrode 22 may be formed in the groove 51, and thereon, the second-layer electrode 222 is formed via the insulation film 223. In this example, both the first-layer electrode 221 and the second-layer electrode 222 are fitting within the groove 51. The light-shielding film 33 is so formed as to cover the electrode 22 (second-layer electrode 222), and to fill the gaps between the second-layer electrode 222 and the sidewalls of the groove 51 via the inter-layer insulation film 31. At the bottom substrate 11 of the groove 51, the pixel separation region 61 is formed.

Figure 6C:
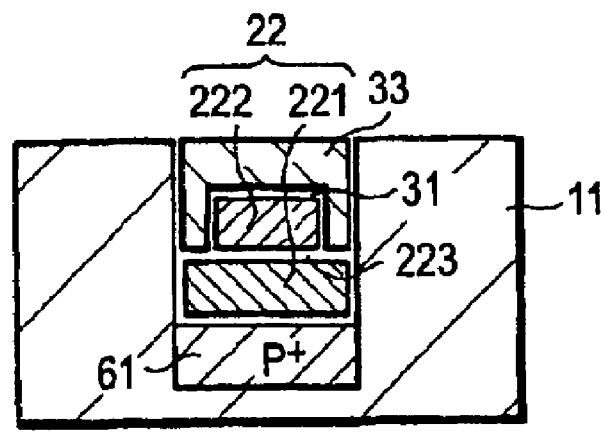

In a still alternative structure, referring to FIG. 6C, between the photoelectric conversion regions 12 in the vertical transfer direction, the first-layer electrode 221 of the electrode 22 may be formed in the groove 51, and thereon, the second-layer electrode 222 is formed via the insulation film 223. The light-shielding film 33 is so formed as to cover the electrode 22 (second-layer electrode 222), and to fill the gaps between the second-layer electrode 222 and the sidewalls of the groove 51 via the inter-layer insulation film 31. In this example, the first-layer electrode 221, the second-layer electrode 222, and the light-shielding film 33 are all fitting within the groove 51. At the bottom substrate 11 of the groove 51, the pixel separation region 61 is formed. In this structure, the depth of the groove 51 can be decreased to be the total height of these three constituents or less, i.e., the first-layer electrode 221, the second-layer electrode 222, and the light-shielding film 33.

Figure 7:
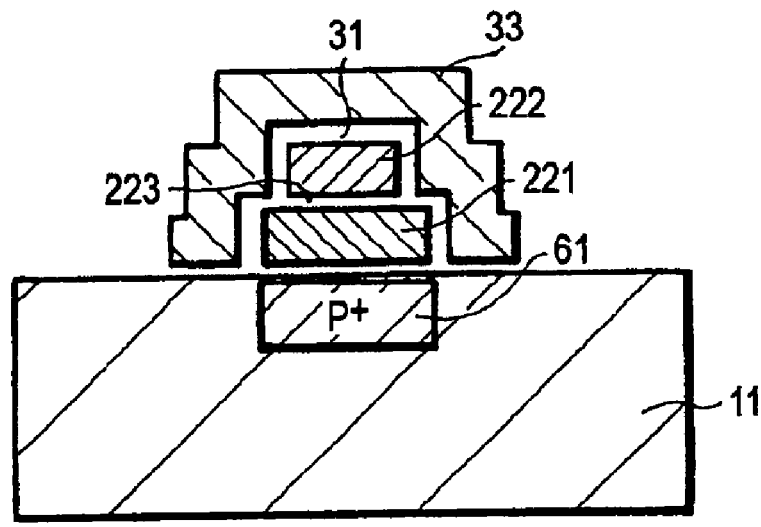
FIG. 7 is a schematic cross-sectional view of a conventional structure between photoelectric conversion regions in the vertical transfer direction.

For comparison purpose, by referring to the schematic cross-sectional view of FIG. 7, described now is the conventional structure of the part between the photoelectric conversion regions in the transfer register direction (vertical transfer direction).

As shown in FIG. 7, on the pixel separation region 61 on the substrate 11, the first-layer electrode 221 of the electrode 22 is formed, and thereon, the second-layer electrode 222 is formed via the insulation film 223. Over the first- and second-layer electrodes 221 and 222, the light-shielding film 33 is formed via the inter-layer insulation film 31. As such, the substrate 11 carries thereon all the first-layer electrode 221, the second-layer electrode 222, and the light-shielding film 33, resulting in the large height difference due to their total height.

With the structure described by referring to FIGS. 6A to 6C, on the other hand, the groove 51 at least includes therein the first-layer electrode 221, or there together, also includes the second-layer electrode 222, the light shielding film 33, and others. Thanks to such a structure, also in the part between the photoelectric conversion regions 12, the height difference can be reduced in the vertical transfer direction.

Also in the above fourth embodiment, similarly to the first to third embodiments described by referring to FIGS. 1A to 3, it is preferable that the part of the electrode 22 formed in the vertical transfer direction is located on the vertical register 16 and the reading gate 15 in the groove 51. As an alternate structure, the part of the electrode 22 in the vertical transfer direction may be formed with any displacement caused during mask alignment in a lithography process is allowed, in the groove 51, at least partially on the pixel separation region 19, and on the vertical register 16 and the reading gate 15. As a still alternate structure, for the same reasons, the part of the electrode 22 formed in the vertical transfer direction may be formed, in the groove 51, at least partially on the pixel separation region 19, and partially on the vertical register 16 and the reading gate 15.

In the above fourth embodiment, as shown in the schematic cross-sectional view of FIG. 4, the sidewalls of the groove 51 may be formed by slope planes. The slope plane is sloped with respect to the surface of the substrate 11 at an angle of 90 degrees or smaller. By sloping the sidewalls of the groove 51 as such, light L and a charge q are not directed toward the vertical register 16 any more. Accordingly, the smear characteristics can be reduced with noise reduction. Herein, the light L is the one reflected below the light-shielding film 33, and the charge q is a result of photoelectric conversion on the very surface of the photoelectric conversion region (sensor).

The substrate 11 of the slope planes of the groove 51 is a $P^+$-type layer, e.g., the hole accumulation layer 13. Such a structure prevents noise occurrence.

In the above fourth embodiment, the light-shielding film 33 is preferably applied with a pulse voltage, or a direct voltage. Through voltage application as such to the light-shielding film 33, noise occurrence is successfully prevented. In the case of applying the pulse voltage to the light-shielding film 33, the light-shielding film 33 can be applied with pulses synchronized to reading pulses. This accordingly assists reading so that the reading voltage can be reduced. In the case of applying the direct voltage to the light-shielding film 33, the surface of the sensor can be provided with pinning enhancement. Similarly, through application of a negative voltage at the time of charge transferring, the reading gate 15 can be increased in height to block the potential. As a result, the blooming characteristics can be improved.

In the above fourth embodiment, with one sidewall of the groove 51, the reading gate 15 may be so formed as to be placed across the substrate 11 of the groove 51 locating upper to the sidewall. Such a structure favorably prevents noise.

Fifth Embodiment

Described next is a solid-state image pickup device 5 of a fifth embodiment by referring to FIG. 8 for a schematic cross-sectional view. The structure of the fifth embodiment is applicable to the solid-state image pickup devices described in the first to fourth embodiments, respectively, and the groove bottom at which the vertical register is formed is plurally segmented in height (two in FIG. 8) in the groove formed to the respective solid-state pickup element described in the first to fourth embodiments.

Figure 8:
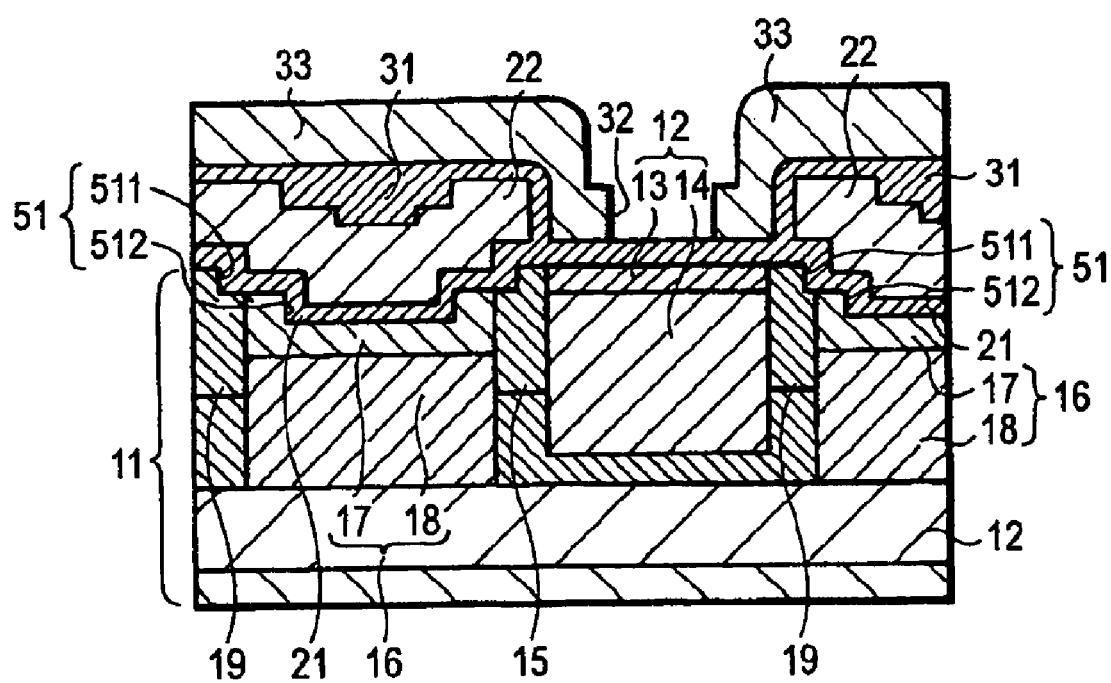
FIG. 8 is a schematic cross-sectional view of a solid-state image pickup device of a fifth embodiment of the present invention.

As shown in FIG. 8, the substrate 11 is formed with the groove 51 that is plurally segmented in height (in the drawing, exemplarily two). This groove 51 is formed to a region in which an electrode is to be formed in the transfer register direction (vertical transfer region), for example. The groove 51 has the depth of 0.01 μm to 5 μm from the surface of the substrate 11, for example. This depth is about the same or less as that of a bonding section between the hole accumulation layer 13 and the N-type layer 14, both of which are formed on the photoelectric conversion region 12. The substrate 11 is a semiconductor substrate, e.g., silicon substrate. The groove 51 and the photoelectric conversion region 12 are formed adjacent to each other. The photoelectric conversion region 12 has the upper layer of the hole accumulation layer 13, the N-type layer 14 is located below. From the side of the photoelectric conversion region 11, at the substrate bottom of the groove 51, the reading gate 15, the transfer register (vertical register) 16, and the pixel separation region 19 are formed on the substrate 11 to the bottom of the groove 51. The vertical register 16 is formed at the bottom of a first segment 511 in such a manner as to include a second segment (bottom segment) 512 of the groove 51. The reading gate 15 is a P$^-$-type layer. The vertical register 16 has the upper layer of the N-type layer 17, and the lower layer of the P$^+$-type layer 18. To be specific, the reading gate 15 is so formed as to include sidewalls of the first segment 511 of the groove 51, and sidewalls of the second segment 512 of the groove 51 are at least partially included in the vertical register 16. Further, to the P$^+$-type layer 18 of the vertical register 16 in the substrate 11, a P-type well 41 is formed in the horizontal direction over the substrate surface. Note here that the sidewalls of the first and second segments 511 and 512 of the groove 51 may be sloped.

The gate insulation film 21 is so formed as to cover the surface of the substrate 11 and the inner plane of the groove 51. In the groove 51 that is covered by the gate insulation film 21, the electrode 22 is formed for charge reading and transferring. In this example, the electrode 22 is formed in a two-layer structure. This is not restrictive, and the electrode 22 may be in a one-, three-, or four-layer structure. As shown in the drawing, this electrode 22 is preferably formed directly above the reading gate 15 and the vertical register 16.

On the surface of the substrate 11, the inter-layer insulation film 31 is so formed as to cover the electrode 22. Thereover, the light-shielding film 33 is formed via the inter-layer insulation film 21 with the opening on the photoelectric conversion region 12. Although not shown, this light-shielding film 33 may be so formed as to fill the gap between the sidewall of the groove 11 and the electrode 22 via the inter-layer insulation film 21.

Figure 9A:
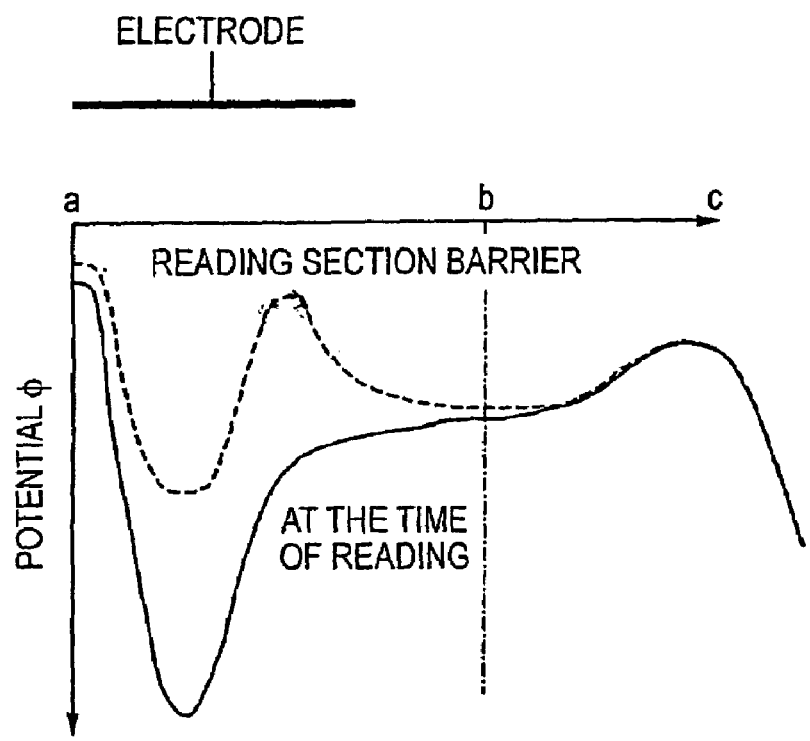
FIG. 9A is a diagram showing a potential curve of the solid-state image pickup device of the first embodiment.
Figure 9B:
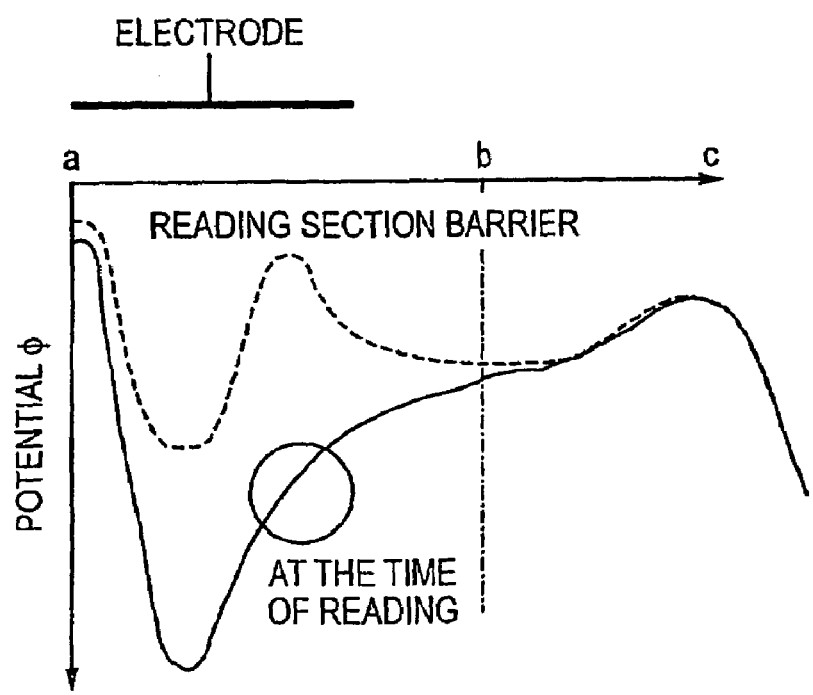
FIG. 9B is a diagram showing another potential curve of the solid-state image pickup device of the fifth embodiment.

Considered now is the simulated potential with a one-segment groove (structure in the first embodiment), and a two-segment groove (structure in the fifth embodiment). FIGS. 9A and 9B show the result of such simulations. FIG. 9A shows the result with the solid-state image pickup device of the first embodiment, and FIG. 9B shows the result with the solid-state image pickup device of the fifth embodiment. In the drawing, the vertical axis denotes a potential, and the lateral axis of a range between a and b denotes the depth, in the transfer register direction, from the pixel separation region 19 to the N-type layer 14 of the photoelectric conversion region 12. In the depth, the N-type layer 18 of the vertical register 16, and the reading gate 15 are included. The lateral axis of a range between b and c denotes the depth direction of the N-type layer 14 of the photoelectric conversion region 12.

As is known from FIGS. 9A and 9B, the potential of the solid-state image pickup device of the fifth embodiment shows a smoother curve on the reading gate side at the time of reading (part indicated by a circle in the drawing). This means that the reading gate does not block the potential that much, advantageously the charge is easily read than the solid-state image pickup device of the first embodiment.

With the solid-state image pickup device 5 described as above by referring to FIG. 8, the same effects can be achieved as the solid-state image pickup device 1 of the first embodiment. Further, with the groove that is plurally segmented in height, the amount of charge for the vertical transfer section to handle can be increased while reducing the reading voltage. What is more, reducing the reading voltage favorably leads to lower power consumption, thereby reducing any disadvantage often caused by the charge left unread by the photoelectric conversion section. Moreover, increasing the amount of charge for the vertical transfer section successfully leads to the more amount of saturation signal.

Sixth Embodiment

Described next is a solid-state image pickup device of a sixth embodiment by referring to FIG. 10 for a schematic cross-sectional view.

Figure 10:
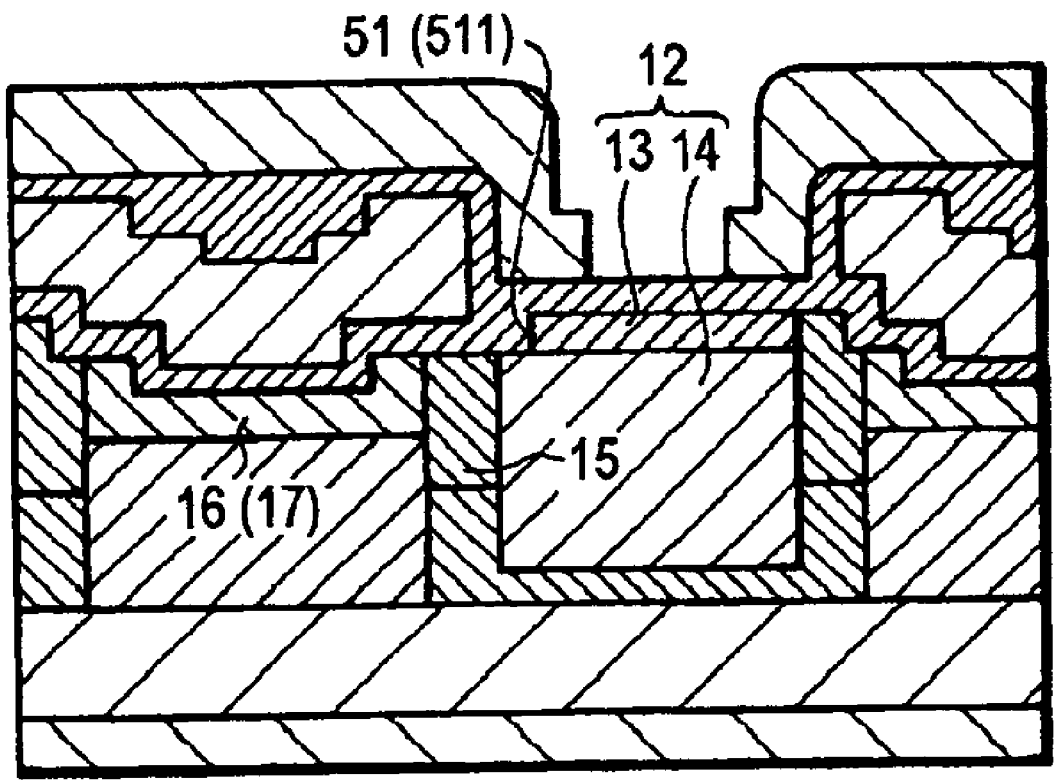
FIG. 10 is a schematic cross-sectional view of a solid-state image pickup device of a sixth embodiment of the present invention.

As shown in FIG. 10, the structure of the sixth embodiment is the same as that of the fifth embodiment except the following. That is, in the sixth embodiment, the first segment 511 of the groove 51 is so formed as to fall on the photoelectric conversion region 12. Accordingly, sidewall parts of the first segment 511 of the groove 51 are included in the hole accumulation layer 13 of the photoelectric conversion section 12, which is structured by the hole accumulation layer 13 and the N-type layer 14. At the bottom of the first segment 511 of the groove 51, formed are a part of the N-type layer 14 of the photoelectric conversion 12, the reading gate 15, and the N-type layer 17 of the vertical register 16.

With the groove 51 structured as such, the same effects as described in the first and fifth embodiments can be achieved, e.g., reduction of the smear characteristics, and reduction of the reading voltage.

Seventh Embodiment

Described next is a solid-state image pickup device of a seventh embodiment by referring to FIG. 11 for a schematic cross-sectional view.

Figure 11:
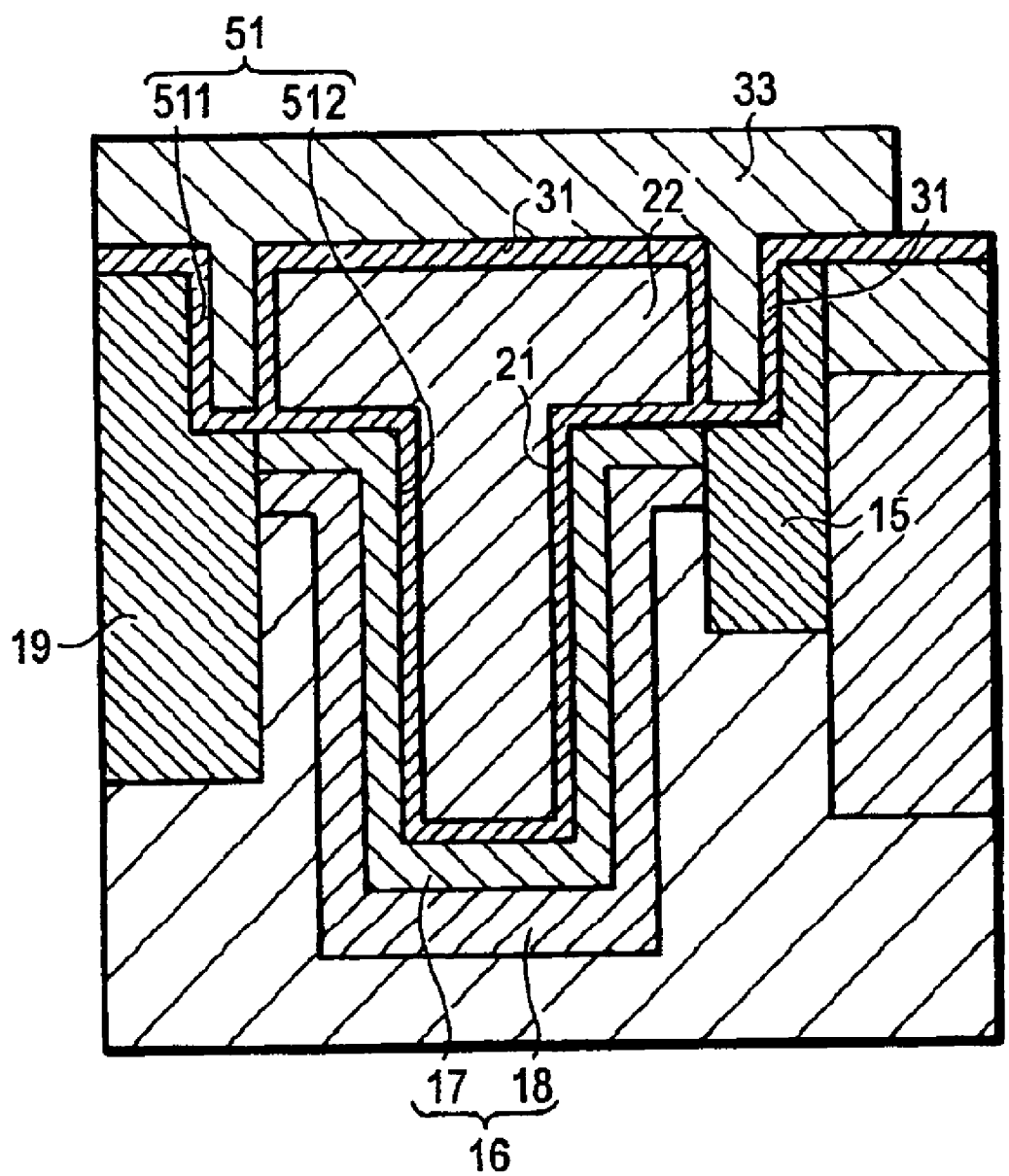
FIG. 11 is a schematic cross-sectional view of a solid-state image pickup device of a seventh embodiment of the present invention.

As shown in FIG. 11, the structure of the seventh embodiment is the same as that of the fifth embodiment except the following. That is, the groove 51 and the vertical transfer section 16 are structured as follows. The groove 51 is bi-segmented (first segment 511 and second segment 512). The bottom part of the second segment 512 is located deeper than the pixel separation region 19 and the reading gate 15. Around the second segment 512, formed is the vertical register 16 that is structured by the N-type layer 512 and the P$^+$-type layer 18 formed therearound. On the vertical register 16, the electrode 22 is formed via the gate insulation film 21 to fit embedded in the groove 51, for example. The other constitutions are the same as the solid-state image pickup device 1 in the first embodiment. The light-shielding film 33 is so formed as to cover the electrode 22 via the inter-layer insulation film 31, and to fill the parts between the first segment 511 and the second segment 512 of the groove 51 via the inter-layer insulation film 31.

With the groove 51 and the electrode 22 formed as such in the seventh embodiment, the same effects as described in the first and fifth embodiments can be achieved, e.g., reduction of the smear characteristics, and reduction of the reading voltage. Further, by increasing the depth of the groove 51., the amount of charge can be increased for the vertical transfer section to handle. This successfully leads to the more amount of saturation signal.

The groove 51 in the above embodiments preferably has rounded corners. Such rounded corners avoid causing stress concentration thereto, whereby the solid-state image pickup device can be favorably improved in reliability.

Eighth Embodiment

Described next is a manufacturing process of the solid-state image pickup device of an eighth embodiment by referring to FIGS. 12A to 12G, all cross-sectional views showing the manufacturing process in sequence.

Figure 12A:
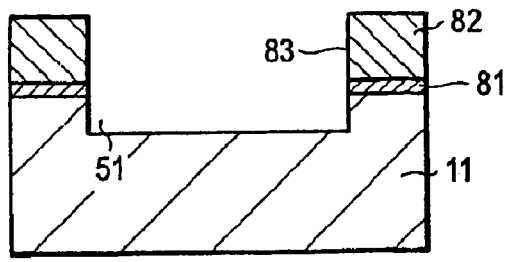
FIGS. 12A to 12G are all a cross-sectional view showing, in sequence, a solid-state image pickup device manufacturing process of an eighth embodiment of the present invention.

By referring to FIG. 12A, first, the substrate 11 is formed thereon with a hard mask layer 81 being an oxidation film or a nitride film. Then, a resist film 82 is formed through resist coating. The substrate 11 is a semiconductor substrate, e.g., silicon substrate. The resist film 82 is formed with an opening 83 through lithography. The resulting resist film 82 is used as an etching mask to apply etching to the hard mask layer 81 and the substrate 11. In this manner, the groove 51 is formed. When applying etching as such, only the hard mask layer 81 may be used as an etching mask. In the above, etching means dry etching or wet etching. To realize reduction of the reading voltage, the depth of the groove 51 at this time needs to be 0.01 μm or more, i.e., the depth of reaching the maximum potential of the N-type layer of the photoelectric conversion region, which will be formed later. With the current device structure, the required depth will be about 5 μm. The sidewalls of the groove 51 are sloped with respect to the surface of the substrate 11 at an angle of 90 degrees or smaller. The sloping angle can be determined through arbitrary selection of the etching requirements. With the angle determined as such, the smear characteristics can basically be suppressed. In an exemplary experiment, a groove is formed with the depth of 100 nm, and its sidewalls are sloped at an angle of 45 degrees. With such a structure, the smear characteristics can be reduced by about 4 to 5 dB. In the process, the register 82 and the hard mask layer 81 are both removed.

Figure 12B:
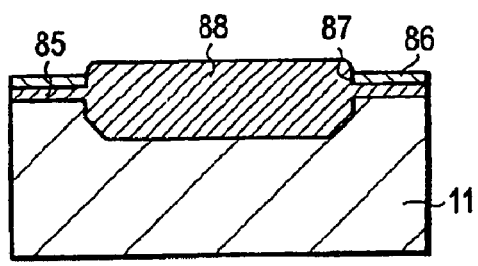

Alternatively, the groove 51 maybe formed in the following manner. As shown in FIG. 12B, the substrate 11 is formed with an oxidation film 88 through local oxidation. In more detail, the substrate 11 is first formed on its surface with a sacrificial oxidation film 85, and a hard mask, e.g., nitride film, 86. Thereafter, through lithography and etching, an opening 87 is formed to a region desired for groove formation. Then, the substrate 11 is subjected to local oxidation using the hard mask 86 so that the local oxidation film 88 is formed. The hard mask 86, the sacrificial oxidation film 85, the local oxidation film 88, and others are removed through etching. In this manner, the groove 51 can be also formed to the substrate 11. Further, the sloping angle of the sidewalls of the groove 51 can be determined through arbitrary selection of the oxidation requirements.

Figure 12C:
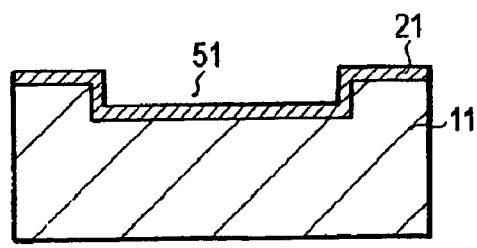

Next, by referring to FIG. 12C, the gate insulation film 21 is formed over the surface of the substrate 11 and the inner plane of the groove 51 for the vertical register and the reading gate.

Figure 12D:
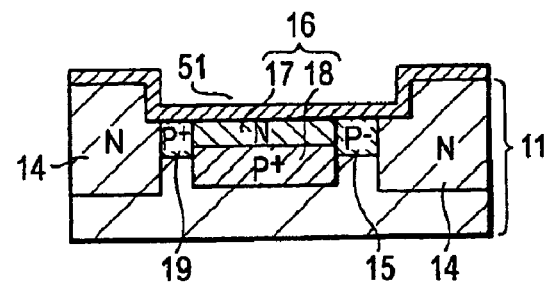

Then, by referring to FIG. 12D, through any existing impurity doping, e.g., ion implantation, the reading gate 15 being a $P^-$-type layer is formed at the substrate bottom of the groove 51. The pixel separation region 19 being a $P^+$-type layer is also formed. Then, the vertical register 16 is formed with the $P^+$-type layer 18 and the N-type layer 17, those of which are layered in this order. The substrate 11 is then formed with the N-type layer 14 serving as a photoelectric conversion region. If with impurity doping, a resist mask is formed on an as-needed basis.

Figure 12E:
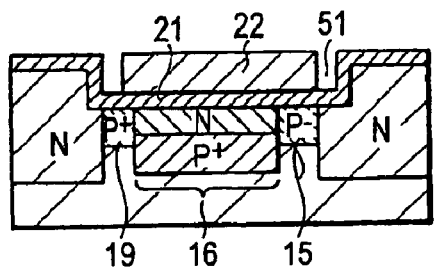

Then, by referring to FIG. 12E, the electrode 22 is formed on the gate insulation layer 21 in the groove 51 for charge reading and transferring. The electrode 22 is formed through the technology of forming a transfer electrode for a solid-state image pickup device of a general type. The electrode 22 is in a one-, two-, three-, or four-layer structure. It is preferable that the part of the electrode 22 formed in the vertical transfer direction is located on the vertical register 16 and the reading gate 15 in the groove 51. As an alternate structure, the part may be formed at least partially on the pixel separation region 19, and on the vertical register 16 and the reading gate 15 due to any displacement caused during mask alignment in a lithography process, any etching error, and the like. As a still alternate structure, the part may be formed at least partially on the pixel separation region 19, and partially on the vertical register 16 and the reading gate 15.

Figure 12F:
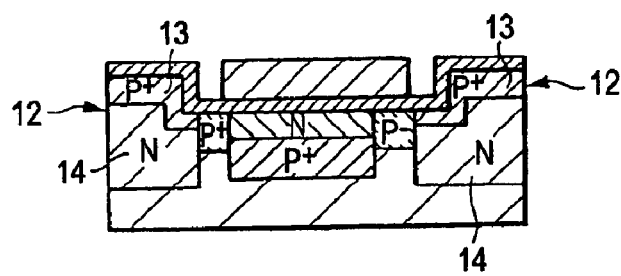

Next, by referring to FIG. 12F, the hole accumulation layer 13 is formed on the N-type layer 14 through impurity doping, e.g., ion implantation. The result derived thereby is the photoelectric conversion region 12 consisting of the N-type layer 14 and the hole accumulation layer 13. The consideration here is that, at this time, the sidewall parts of the groove 51 are susceptible to etching damage, or to crystal defect due to stress generated during local oxidation, for example. Thus, electrons generated from such parts suffered from etching damage or crystal defect are likely to be noise components. To reduce the noise components, the substrate surface sides of the sidewall parts of the groove 51 are implanted with a P-type impurity.

Figure 12G:
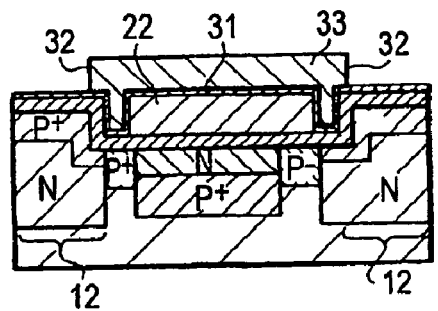

By referring to FIG. 12G, the inter-layer insulation film 31 is then formed to cover the electrode 22. Next formed is the light-shielding film 33 on the substrate 11 via the inter-layer insulation film 31 in such a manner as to fill the gap between the groove 51 and the electrode 11. As such, with the light-shielding film 33 entirely or partially filling the gap between the groove 51 and the electrode 22, the vertical register 16 can be protected from light components that are usually directly directed thereinto. Accordingly, smear as a part of noise components of CCDs (Charge-Coupled Device) can be blocked. Thereafter, through lithography and etching, the light-shielding film 33 on the photoelectric conversion region 12 is processed to form the opening 32.

In the above manufacturing method, it is preferable to equalize the depth between the groove 51 and the bonding section between the hole accumulation layer 13 and the N-type layer 14, both of which are formed on the photoelectric conversion region 12. The light-shielding film 33 is preferably applied with a pulse voltage, or a direct voltage.

The solid-state image pickup device manufactured by the above method is the one derivable of the effects described in the above first to fourth embodiments.

Ninth Embodiment

Described next is a manufacturing process of the solid-state image pickup device of a ninth embodiment by referring to FIGS. 13A to 12C, all cross-sectional views showing the manufacturing process in sequence.

Figure 13A:
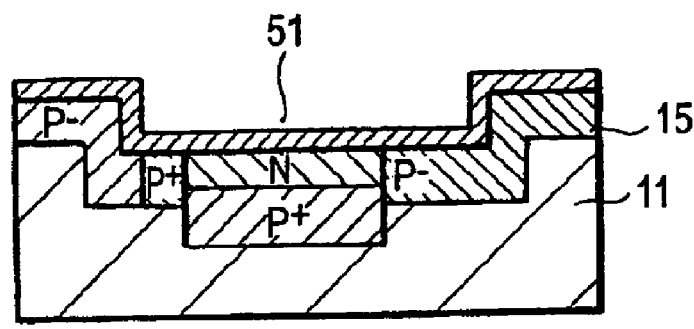
FIGS. 13A to 13C are all a cross-sectional view showing, in sequence, a solid-state image pickup device manufacturing process of a ninth embodiment of the present invention.

By referring to FIG. 13A, in the process of FIG. 12C, a slight amount of P⁻-type impurity is implanted into the surface of the substrate 11 and the inner plane of the groove 51 so that the reading gate 15 is formed with the resulting P⁻-type layer.

Figure 13B:
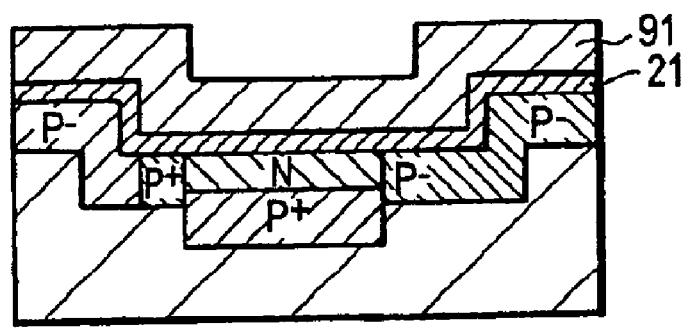

Next, by referring to FIG. 13B, an electrode formation film 91 is formed on the gate insulation film 21 for forming an electrode for charge reading and transferring.

Figure 13C:
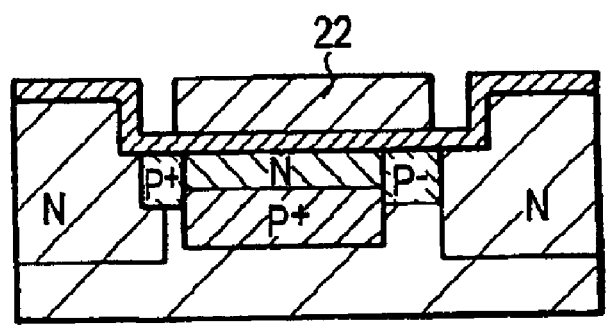

Then, by referring to FIG. 13C, through lithography and etching, the electrode formation film is changed in shape of an electrode for charge reading and transferring. The result through such a process is the electrode 22. Then, the electrode 22 may be used as a mask to form the N-type layer 14 of the photoelectric conversion region 12 through so-called self-matching. In this manufacturing method, the reading gate 15 is formed with some width displacement from the vertical register 16 and the photoelectric conversion region 12. This eases to manufacture the reading gate 15 with accuracy, and surely reduces manufacturing variations. Thereafter, executed is the process after the step described by referring to FIG. 12F.

Tenth Embodiment

Described next is a manufacturing process of the solid-state image pickup device of a tenth embodiment by referring to FIGS. 14A to 15F, all cross-sectional views showing the manufacturing process in sequence.

Figure 14A:
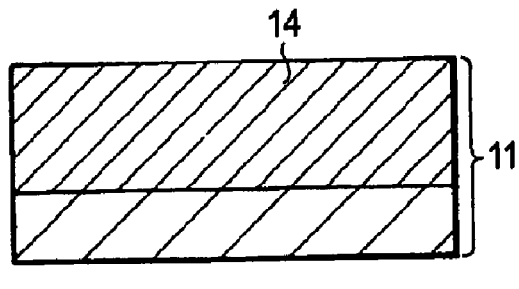
FIGS. 14A to 14F are all a cross-sectional view showing, in sequence, a solid-state image pickup device manufacturing process of a tenth embodiment of the present invention.

By referring to FIG. 14A, the substrate 11 is made ready. The substrate 11 is a semiconductor substrate, e.g., silicon substrate. First, to the substrate 11, an N-type impurity is doped to form the N-type layer 14. This doping is done through ion implantation, for example.

Figure 14B:
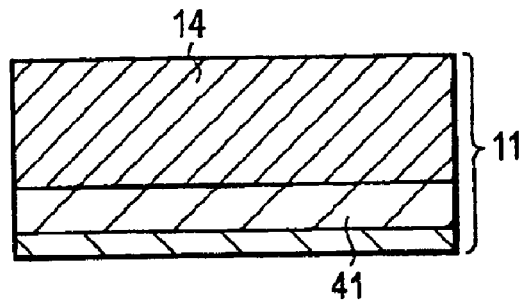

Then, by referring to FIG. 14B, a P-type impurity is doped beneath the N-type layer 14 thus formed to the substrate 11 to form the P-type well 41.

Figure 14C:
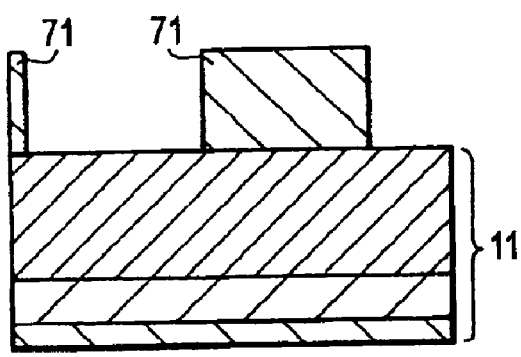

Next, by referring to FIG. 14C, after forming a resist film on the substrate 11 through resist coating in a general manner, the resulting resist film is subjected to patterning through lithography in a general manner to form a mask 71. Herein, the mask 71 is to be used for forming a first groove segment to the substrate 11.

Figure 14D:
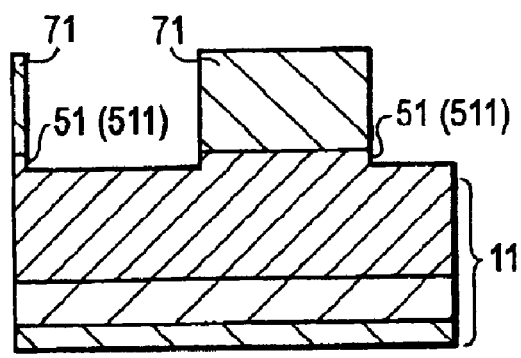

Specifically, by referring to FIG. 14D, the substrate 11 is etched using the mask 71 so that the first segment 511 of the groove 51 is formed on the surface side of the groove 51. Thereafter, the mask 71 is removed.

Figure 14E:
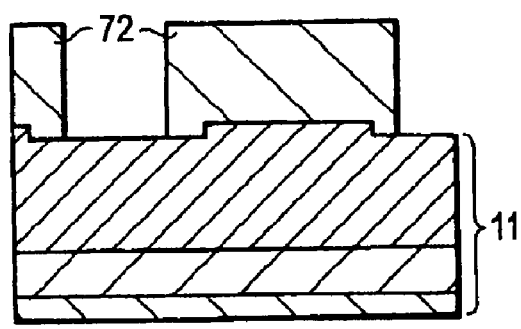

By referring to FIG. 14E, after forming the resist film on the substrate 11 through resist coating in a general manner, the resulting resist film is subjected to patterning through lithography in a general manner to form a mask 72. Herein, the mask 72 is to be used for forming a second groove segment to the substrate 11.

Figure 14F:
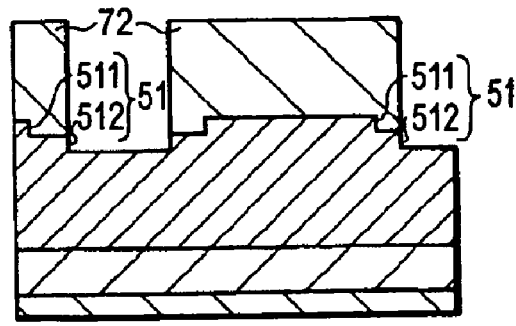

Specifically, by referring to FIG. 14F, the substrate 11 is etched using the mask 72 so that the second segment 512 of the groove 51 is formed at the bottom of the first segment 511. Here, the second segment 512 is narrower in width and deeper in depth than the first segment 511. Thereafter, the mask 72 is removed. In an alternate structure, the sidewalls of the first and second segments 511 and 512 may be sloped.

Figure 15A:
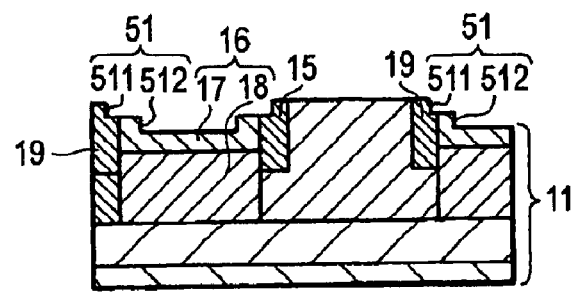
FIGS. 15A to 15F are all a cross-sectional view showing, in sequence, the solid-state image pickup device manufacturing process of the tenth embodiment of the present invention.

Next, by referring to FIG. 15G, through any existing impurity doping, e.g., ion implantation, the reading gate 15 structured by the P⁻-type layer is so formed as to fall on the first segment 511 of the groove 51. Similarly, the pixel separation region 19 structured by the P⁺-type layer is so formed as to fall on the first segment 511 of the groove 51. The P⁺-type layer 18 is formed to the substrate 11 between the reading gate 15 and the pixel separation region 19. Herein, the P⁺-type layer is so formed as to be deeper than both the reading gate 15 and the pixel separation region 19. Then, on the P⁺-type layer 18, the N-type layer 17 is so formed as to fall on the bottom part of the first segment 511 of the groove 51 together with the second segment 512 thereof. As a result, the vertical register 16 is formed. If with impurity doping, a resist mask is formed on an as-needed basis.

Figure 15B:
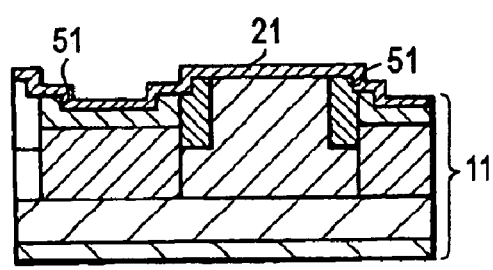

Next, by referring to FIG. 15B, the gate insulation film 21 is formed over the surface of the substrate 11 and the inner plane of the groove 51 for the vertical register and the reading gate.

Figure 15C:
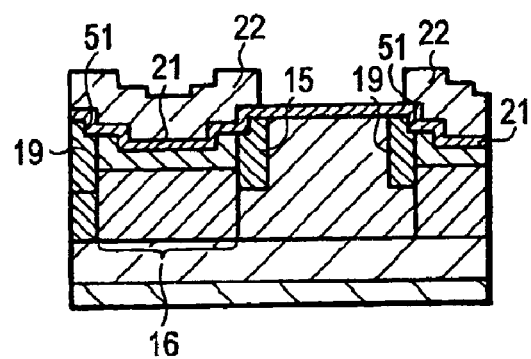

Then, by referring to FIG. 15C, the electrode 22 is formed on the gate insulation layer 21 in the groove 51 for charge reading and transferring. The electrode 22 is formed through the technology of forming a transfer electrode for a solid-state image pickup device of a general type. The electrode 22 is in a one-, two-, three-, or four-layer structure. It is preferable that the part of the electrode 22 formed in the vertical transfer direction is located on the vertical register 16 and the reading gate 15 in the groove 51. As an alternate structure, the part may be formed at least partially on the pixel separation region 19, and on the vertical register 16 and the reading gate 15 due to any displacement caused during mask alignment in a lithography process, any etching error, and the like. As a still alternate structure, the part may be formed at least partially on the pixel separation region 19, and partially on the vertical register 16 and the reading gate 15.

Figure 15D:
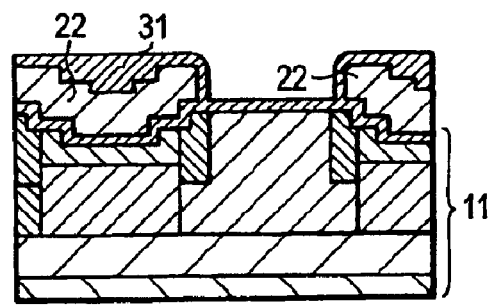

Next, by referring to FIG. 15D, the inter-layer insulation layer 31 is formed on the substrate 11 to cover the electrode 22.

Figure 15E:
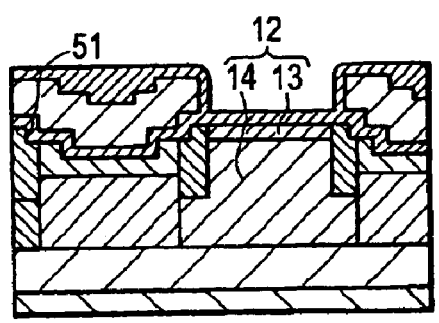

Next, by referring to FIG. 15E, the hole accumulation layer 13 is formed on the N-type layer 14 through impurity doping, e.g., ion implantation. The result derived thereby is the photoelectric conversion region 12 including the N-type layer 14 and the hole accumulation layer 13. The consideration here is that, at this time, the sidewall parts of the groove 51 are susceptible to etching damage, or to crystal defect due to stress generated during local oxidation, for example. Thus, electrons generated from such parts suffered from etching damage or crystal defect are likely to be noise components. To reduce the noise components, the substrate surface sides of the sidewall parts of the groove 51 are implanted with a P-type impurity.

Figure 15F:
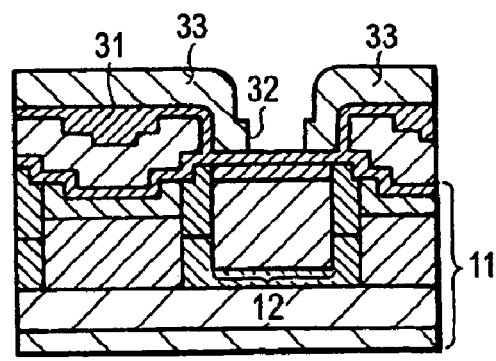
Figure 16A:
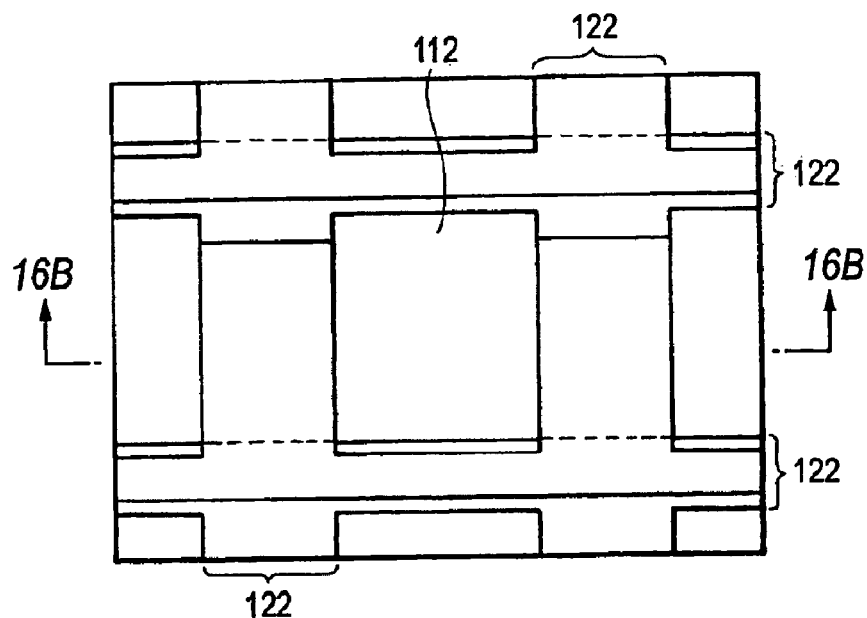
FIGS. 16A and 16B are both a diagram showing a conventional solid-state image pickup device operating in an interlace mode, and specifically.
Figure 16B:
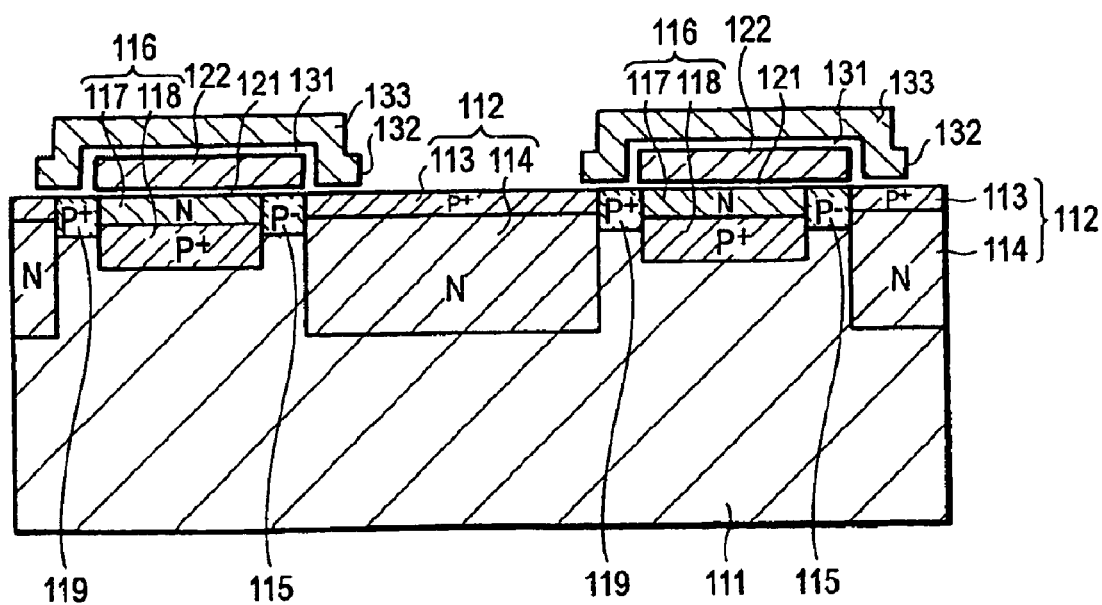

By referring to FIG. 15F, the light-shielding film 33 is so formed as to cover the electrode 22 via the inter-layer insulation film 31. Thereafter, through lithography and etching, the light-shielding film 33 on the photoelectric conversion region 12 is processed to form the opening 32.

In the above manufacturing method, although not shown, similarly to the eighth embodiment, the electrode 22 may be embedded in the groove 51. If this is the case, the light-shielding film 33 can be formed between the electrode 22 and the sidewall of the groove 51 via the inter-layer insulation film 31. As such, entirely or partially filling the gap between the groove 51 and the electrode 22 with the light-shielding film 33, the vertical register 16 can be protected from light components that are usually directly directed thereinto. Accordingly, smear as a part of noise components of CCDs (Charge-Coupled Device) can be reduced.

In the above manufacturing method, the light-shielding film 33 is preferably formed so as to be applied with a pulse voltage, or a direct voltage.

The solid-state image pickup device manufactured by the above method is the one derivable of the effects described in the above first and fifth embodiments.

In the above, described is an exemplary case in which the present invention is applied to a solid-state image pickup device. This is surely not restrictive, and the present invention is applicable to image-state image pickup apparatuses exemplified by cameras, and camera modules. If applied, the image pickup apparatuses can reduce power consumption, and output images therefrom can be improved in image quality.

In the solid-state image pickup device of the present invention, the substrate is formed with the groove, the vertical register and the reading gate are formed at the bottom of the groove substrate, and the part of the electrode formed in the vertical transfer direction comes in the groove. Such a structure shortens the distance, in the substrate depth direction, among the N-type layer of the photoelectrical conversion region, the N-type layer of the vertical register, and the electrode. This leads greater fluctuations in voltage to be applied to the electrode showing the maximum potential in a charge reading path. Accordingly, the reading voltage can be advantageously reduced. What is better, diffusion caused due to the heat of the hole accumulation layer of the photoelectric conversion region can be shielded by the height difference made by the groove, leading to little influence on the potential of the reading gate. This also advantageously can reduce the reading voltage. Moreover, with the structure of embedding the electrode in the groove, the height difference is reduced in the horizontal direction. Accordingly, the light-gathering capability is improved, consequently leading to the better pixel properties, e.g., sensitivity, and shading. Also with the structure of filling the gap between the electrode and the groove sidewalls with the light-shielding film via the inter-layer insulation film, the smear components often generated by direct light jumping into the vertical register can be advantageously reduced.

According to the solid-state image pickup device of the second embodiment, the groove is lattice-shaped. Accordingly, in the groove, the electrode and the light-shielding film can be partially embedded both in the vertical and horizontal transfer directions. Advantageously, this reduces the height difference to a greater degree, and the same effects as the solid-state image pickup device of the first embodiment can be achieved. According to the solid-state image pickup device of the third embodiment, the groove is plurally segmented in height. Thus, the amount of charge for the vertical transfer section to handle can be increased while reducing the reading voltage. What is more, reducing the reading voltage favorably leads to lower power consumption, thereby reducing any disadvantage often caused by the charge left unread by the photoelectric conversion section. Moreover, increasing the amount of charge for the vertical transfer section successfully leads to the more amount of saturation signal.

In the method for manufacturing the solid-state image pickup device of the present invention, with the structure of filling the gap between the electrode and the groove sidewalls with the light-shielding film, advantageously, the smear components often generated by direct light jumping into the vertical register can be reduced. What is more, with the structure of embedding the electrode in the groove, the height difference can be reduced. Accordingly, advantageously, the light-gathering capability is improved, consequently leading to the better pixel properties, e.g., sensitivity, and shading.

What is claimed is:

1. A solid-state image pickup device including, in a substrate, a plurality of photoelectric conversion regions for subjecting incoming light to photoelectric conversion, and an electrode for reading a signal charge from the photoelectric conversion regions, wherein
a groove is formed on a surface of the substrate, and the electrode is formed at a bottom part of the groove and a light-shielding film is formed to fill at least at a gap between the electrode and a sidewall section of the groove.

2. The solid-state image pickup device according to claim 1, wherein the light-shielding film is applied with a pulse voltage.

3. The solid-state image pickup device according to claim 1, wherein the light-shielding film is applied with a direct voltage.

4. The solid-state image pickup device according to claim 1, wherein including the substrate from the bottom part of the groove to one sidewall section of the groove, the electrode is formed to be placed across the substrate locating upper to the sidewall.

5. The solid-state image pickup device according to claim 1, wherein the groove has a lattice structure.

6. The solid-state image pickup device according to claim 1, wherein the photoelectric conversion region is formed below the light-shielding film.

7. The solid-state image pickup device according to claim 1, further comprising a transfer register formed in the groove.

8. The solid-state image pickup device according to claim 7, wherein
a pixel separation region for partitioning each of the photoelectric conversion regions is formed below the groove in the substrate.

9. The solid-state image pickup device according to claim 8, wherein
the part of the electrode formed in the direction of the transfer register is formed, in the groove, at least partially on the pixel separation region, and on the transfer register and the reading gate.

10. The solid-state image pickup device according to claim 8, wherein
the part of the electrode formed in the direction of the transfer register is formed, in the groove, at least partially on the pixel separation region, and partially on the transfer register and the reading gate.

11. The solid-state image pickup device according to claim 1, wherein a sidewall section of the groove is structured by a slope plane.

12. The solid-state image pickup device according to claim 11, wherein the slope plane has a substrate of a p-type layer.

13. The solid-state image pickup device according to claim 1, wherein the groove is plurally segmented.

14. The solid-state image pickup device according to claim 13, wherein the groove is bi-segmented,
a sidewall section of a first segment of the groove is included in the electrode, and
a sidewall section of a second segment of the groove is at least partially included in the other electrode.

15. A solid-state image pickup apparatus, comprising:

a solid-state image pickup device including, in a substrate, a plurality of photoelectric conversion regions, for subjecting incoming light to photoelectric conversion, and an electrode for reading a signal charge from the photoelectric conversion regions, an optical system for directing the incoming light to the solid-state image pickup device, wherein the solid-state image pickup device has a groove formed on a surface of the substrate, and the electrode is formed at a bottom part of the groove.

* * * * *